(12) United States Patent
Scaman et al.

(10) Patent No.: US 6,242,923 B1
(45) Date of Patent: Jun. 5, 2001

(54) METHOD FOR DETECTING POWER PLANE-TO-POWER PLANE SHORTS AND I/O NET-TO POWER PLANE SHORTS IN MODULES AND PRINTED CIRCUIT BOARDS

(75) Inventors: Michael E. Scaman, Peekskill; Edward J. Yarmchuk, Mahopac; Arnold Halperin, Cortlandt Manor, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/116,396

(22) Filed: Jul. 16, 1998

Related U.S. Application Data

(63) Continuation-in-part of application No. 08/807,076, filed on Feb. 27, 1997, now Pat. No. 5,821,759.

(51) Int. Cl.[7] ............................. G01R 31/28; G01R 31/08
(52) U.S. Cl. ............................. 324/529; 324/531
(58) Field of Search .................... 324/529, 530, 324/528, 524, 526, 531, 537, 95; 438/17

(56) References Cited

U.S. PATENT DOCUMENTS

| | | |
|---|---|---|
| 1,158,086 | 10/1915 | Vahey . |
| 2,226,021 | 12/1940 | Schweitzer, Jr. . |
| 2,249,166 | 7/1941 | Parker et al. . |
| 2,698,921 | 1/1955 | Wharton . |
| 2,769,868 | 11/1956 | Brownlow . |
| 2,974,274 | 3/1961 | Lindberg, Jr. et al. . |
| 3,753,089 | 8/1973 | Gunn et al. . |
| 3,882,287 | 5/1975 | Simmonds . |
| 4,829,238 | 5/1989 | Goulette et al. . |
| 5,006,788 | 4/1991 | Goulette et al. . |
| 5,073,754 | * 12/1991 | Henley ................ 324/529 |
| 5,578,930 | * 11/1996 | Sheen .................. 324/530 |
| 5,631,572 | * 5/1997 | Sheen et al. ......... 324/754 |
| 5,821,759 | * 10/1998 | Scaman et al. ....... 324/529 |

OTHER PUBLICATIONS

IBM Technical Disclosure Bulletin, "Electro–Optic Sampling for Multi–Layer Ceramic Test," vol. 38, No. 05, May 1995, pp. 177–179.

\* cited by examiner

*Primary Examiner*—Safet Metjahic
*Assistant Examiner*—James C Kerveros
(74) *Attorney, Agent, or Firm*—H. Daniel Schurmann

(57) ABSTRACT

A method of locating in a non-destructive and non-invasive manner power plane-to-power plane shorts or I/O net-to-power plane shorts found in a printed circuit board or a multi-chip-module by way of a magnetic field generating probe is described. Thousands of nets can be simultaneously tested to detect not only the presence of a short but also to accurately pinpoint its position. For high resistance shorts, the probe is provided with a pot core housed inductor located at its tip, and is used at low frequencies to minimize the effect of the capacitive impedance between the power planes. For low resistance shorts, the probe is used at high frequencies, delivering equal but opposite current to each of two matched inductors at the tip of the probe to maximize mutual inductive coupling while minimizing electrostatic capacitive coupling with the board or module. In both cases, the highest current stress is on the probe rather than on the expensive and fragile package under inspection. This allows the test to be both more sensitive to high resistance shorts at low frequencies and is less destructive, thereby being less likely to blow filamentary shorts due to high current stresses through the board or module.

29 Claims, 3 Drawing Sheets

METHOD FOR DETECTING POWER PLANE-TO-POWER PLANE SHORTS AND I/O NET-TO POWER PLANE SHORTS IN MODULES AND PRINTED CIRCUIT BOARDS

CROSS-CORRELATION TO OTHER PATENTS

This application is a continuation-in part of U.S. patent application Ser. No. 08/807,076, filed on Feb. 27, 1997, and now issued as U.S. Pat. No. 5,821,759.

FIELD OF THE INVENTION

This invention is related to the testing and inspection of multi-chip modules or printed circuit boards and, more particularly, to a method of locating shorts between voltage planes or between I/O nets and power planes for purposes of diagnostics and repair.

BACKGROUND OF THE INVENTION

Power plane-to-power plane shorts are a common defect that typically necessitate scrapping an electrical component if they are not detected and repaired during the early stages of manufacturing. Locating shorts poses several significant yield and diagnostic problems. Firstly, shorts between power planes in an electronic package such as an MCM-D (multi-chip module provided with thin film layers) or a PCB (printed circuit board) are a generic and perennial problem both for yield and diagnostic considerations. Typically, an ohmmeter is used to determine the presence of power plane-to-power plane defects. However, to precisely locate the short is usually a formidable task, since such a defect can appear anywhere in the active area between adjoining power planes. Additionally, the complex nature of thin-film packaging makes it prohibitively expensive to inspect the entire MCM-D or PCB in order to determine the precise location of a short with a reasonable degree of accuracy. It is, therefore, highly desirable to have a method to pinpoint the location of power plane-to-power plane shorts in the most effective manner possible.

A second problem involves reliability considerations. Certain defects may be exceedingly tenuous, such as filamentary shorts which, typically, blow out when traversed by an even minimal current. For diagnostic considerations, it would be desirable to have a method for locating these fine shorts without destroying them, to gain valuable diagnostic information and helpful hints for an improved manufacturing process. Attempting to view such shorts with infrared techniques most likely will blow the short. Accordingly, as in the previous case, it is highly desirable to subject the short to minimal current stress while attempting to locate the short.

A third problem occurs in some shorts having a high resistance, and oftentimes, a significant amount of power plane-to-power plane capacitance. A method which can locate high resistance shorts in the presence of high power plane-to-power plane capacitance would therefore be highly beneficial.

A fourth problem, involves a specific defect known to be fatal: I/O net-to-power plane shorts. These defects oftentimes occur in an MCM-D on the highly dense TSM (Top Side Metallurgy, i.e., the side of the substrate to which chips are attached) that also involves a BSM (Bottom Side Metallurgy, i.e., the surface of the substrate to which pins are attached I/O nets). Repair opportunities for such nets are typically limited. In the presence of many levels of thin-films, shorts in this category frequently involve a power plane (rather than the more complex case of shorts between I/O nets). Moreover, both, electrical test and automated optical inspection techniques tend to be expensive. Thus, a simple, cost effective method of detecting and locating critical I/O net-to-power plane shorts is likewise highly desirable.

In summary, there is a need in the art of manufacturing MCMs and PCBs for an inspection technique which provides a sensitive and non-invasive approach to locating plane-to-plane defects. These include power plane-to-power plane shorts or any other types of plane-to-plane shorts, as opposed to linear trace applications. Typical linear trace applications include: tracing lines on a PCB; tracing a cable; open testing; and test and inspection of x/y lines on flat panel display applications such as LCD (liquid crystal displays). Practitioners in the art have in the past used pickup coils to locate such defects, mainly in the following applications: linear tracing of cables for shorts within the cable, linear tracing of lines on a PCB, and shorts between x,y lines on panel displays all while driving an oscillating current through the defect. The magnetic Faraday induction approach to be described in this invention is specifically directed towards plane-to-plane shorts and I/O nets-to-power plane shorts.

TSM metal patterns are extremely dense and expensive to make. In such instances, it may be simpler to detect a short with an ohmmeter if the pads on the BSM are provided with contacts to the power planes. Although detecting this type of defect may appear simple, locating the actual defect may be a formidable task since hundreds of thousands of places in the TSM may exist where two power planes or a power plane to an I/O net can short to each other. If two ground shielding planes are built parallel and in close proximity to one another, interlevel shorts can occur anywhere in the plane. It may be difficult and ineffective to rely on unassisted manual inspection of the entire area. It is, therefore, desirable to have an effective area scan method to locate this narrow class of yield detracting defects.

In U.S. patent application Ser. No. 08/807,076, plane-to-plane shorts are localized by an apparatus that includes: a current source; a means for applying current to the plane-to-plane short; an inductive magnetic field sensing probe for sensing changes in the magnetic field around the short; and circuitry for detecting a signal induced in the magnetic field sensing probe, when the probe is in the vicinity of the defect. This approach may subject the fragile electrical component to high current stresses and may lack adequate sensitivity for the more difficult case of finding high resistance power plane-to-power plane shorts.

Other related patents describe various electromagnetic probes to scan electronics packages in a variety of ways, although none address plane-to-plane shorts. The patents listed hereinafter can be divided into several groups according to their respective application: linear current trace probes with probes used as field sensors (electromagnetic); contactless techniques involving electrical testing using radiated electromagnetic signatures, wherein the probe is a field emitter and possibly also a sensor. None of these applications, however, address the special problems and concerns of power plane-to-power plane shorts or high resistance power plane-to-power shorts. Nor do they address the simplified case of I/O net-to-power plane shorts. Nor do they separate signals caused by noise or unwanted capacitive effects from the signal due to a power short.

Techniques for using electromagnetic sensor probes for scanning electronics packages are described in U.S. Pat. No.

5,406,209 to Johnson et al; U.S. Pat. No. 5,714,888 to Naujoks; U.S. Pat. No. 5,218,294 to Soiferman; U.S. Pat. No. 3,992,663 to Seddick; U.S. Pat. No. 4,186,338 to Fitchenbaum; U.S. Pat. No. 5,073,754 to Henley; and U.S. Pat. No. 4,542,333 to Koontz. All of the above utilize a magnetic field sensing probe as opposed to an electromagnetic field generating probe. These patents can be further classified into various groups highlighting different methods, as will be discussed below.

Johnson's U.S. Pat. No. 5,406,209; Naujoks' U.S. Pat. No. 5,714,888 and Soiferman's U.S. Pat. No. 5,218,294 describe an array of broad spectrum electromagnetic sensing probes to scan a module undergoing a functional test in a go/no-go test. In the case of a power plane-to-power plane short, an ohmmeter is presumed to have already detected the presence of a short. In all the methods described above, an electromagnetic signature which was previously generated, is compared to a predetermined signature. A decision is made whether the PCB is good or bad. Generally, all the radiated electromagnetic energies sensed with the predetermined signature of the profile are compared, although the electromagnetic sensed energy is not necessarily helpful in locating a power plane-to-power plane short. A signal which strongly pinpoints the position of a voltage plane short is generated by a magnetic field. In contradistinction, an electrostatic field tends to be a degrading component of the signal due to the presence of a noticeable capacitance between planes or between a plane and the probe. It is, therefore, not considered to be helpful, but rather a hinderance. None of the above patents make a distinction between meaningful and non-meaningful signals. Furthermore, none are sensitive to weak magnetic signals in combination with noise. Nor do they address capacitive effects caused by the plane-to-plane capacitance or by the probe-to-the board under test capacitance. A field sensing probe assumes that the module under test can withstand the necessary current stress to generate an adequate signal to create a field sufficiently large to locate the defect.

Seddick, in U.S. Pat. No. 3,992,663 uses a tape head mounted on an automatic positioning arm to trace a shorted net to locate the short. Similar to Johnson, Seddick uses a probe as a sensor, e.g., a magnetic pick-up device, and not as a magnetic field generating device. This is not as desirable with regard to sensitivity considerations. Furthermore, it is less non-destructive for reasons previously mentioned as the PBC under inspection is stressed by current to produce a signal for the scanning head. The PCB under test may be limited in the amount of current stress that it can be subjected to. This does not address power plane-to-power plane shorts which are not a linear net trace nor does it address high resistance shorts.

Fitchenbaum, in U.S. Pat. No. 4,186,338 describes a manual version of this using a tape head rather than a pickup coil. This approach is also a linear current trace application using a pickup coil probe as a sensor. It uses a simple threshold for detection and will become less effective as noise increases and as the signal decreases.

Both Seddick and Fitchenbaum make a simple comparison of electromagnetic signals received exceeding a given threshold to locate a path for the current. No attempt is made to distinguish meaningful magnetically caused signal from capacitively caused, electrostatically induced signal. Likewise, a broad spectrum is used that lacks the necessary sensitivity to a weak signal buried in noise. This method is also not extendable to high resistance shorts. Furthermore, a single net is being traced. This differs from the approach described herein, wherein a two-dimensional field containing power planes and/or thousands of nets is tested and inspected simultaneously, in which any I/O net is shorted to a power plane.

Henley, in U.S. Pat. No. 5,073,754, is a hybrid of the previously mentioned patents using an array of magnetic field sensors and driving the x,y lines of an LCD display. Searching for defects in x,y lines of LCD displays differs considerably from searching for power plane-to-power plane shorts. In the case of densely packed x,y addressing lines, many parallel x signal lines cross other parallel and distinguishable y lines with the possibility of a short occurring somewhere. In the case of power plane shorts, two individual large areas may be parallel to one another and short anywhere in the entire area. Henley does not address power plane shorts, using instead broad spectrum, current stresses, without distinguishing between meaningful magnetic signal and electrostatic degrading signal. This approach is limited to locating shorts in electronic packages having dense parallel x,y addressing lines, e.g., LCD, but it does not address locating power plane-to-power plane shorts.

Koontz U.S. Pat. No. 4,542,333 uses a Hall effect probe sensor to linearly trace lines in an automotive heating coil (of the type that may be used to heat the rear window of cars). The current must flow through the entire serpentine heating coil. This approach addresses looking for shorts or opens in a narrow application of simple automotive heating coils as a go no go test, but not locating power plane-to-power plane shorts in highly complex boards or modules.

Several other related patents use electrostatic and/or magnetic field sensing probes to scan electronic packages. These include: Khazam U.S. Pat. No. 5,486,753, Sheen U.S. Pat. No. 5,578,930, and Soiferman, both U.S. Pat. Nos. 5,551,110 and 5,424,633. They relate more to testing than to inspection techniques, namely, to determine the goodness of the device under test. These are not pertinent to locating power plane shorts and do not address the case of locating high resistance shorts between power planes which demands a much higher sensitivity. These are test approaches collecting an electromagnetic signature and making a direct compare with a predetermined signature for a go/no go decision. There is no need for such a complex go/no go test for power plane-to-power plane shorts since, as previously mentioned, a power plane short is easily detected with an ohmmeter. The need is not related to detection but rather to the location and inspection of plane-to-plane faults and these methods do not address that necessity.

Khazam, in U.S. Pat. No. 5,486,753 describes a method to induce a capacitive electrostatic signal into a populated PCB, connecting the individual output pins of ICs on the board to selected electronics in order to detect opens capacitively. This is an open test and not a short test, and consequently is not transferable to detect shorts between power planes.

Sheen, in U.S. Pat. No. 5,578,930 describes a method for inducing an electrostatic or magnetic signal into a populated printed circuit board and looking at the individual output pins of Ics on the board with appropriate electronics at the composite signal, and more specifically to whatever combination is usable as a signature. Likewise, Sheen uses a broad spectrum which is not sensitive to a weak signal buried in noise. This method is not extendible to high resistance shorts. Both Sheen and Khazam require much more complex hardware than is necessary for the narrower case of power plane-to-power plane shorts. Further, Sheen teaches an open test and a method of locating power plane-to-power plane shorts.

Soiferman, in U.S. Pat. No. 5,551,110 and 5,424,633 uses an induction coil to induce a voltage gradient in a PCB to test for functionality and quality. This approach also makes a simple comparison of electromagnetic signal received exceeding a threshold to locate a current path. No attempt is made to distinguish magnetically included signal from capacitively induced signal or from random noise. Soiferman looks at the signal as a composite for any effect as a go/no go test. Likewise, Soiferman uses a broad spectrum which is not adequately sensitive to a weak signal buried in noise. This method will not be extendible to high resistance shorts. As mentioned previously, there is no need for a such a complex go/no go test for power plane-to-power plane shorts which are easily detected by an ohmmeter. The need is for a method of locating these shorts for repair and diagnostic purposes in a cost effective manner.

OBJECTS OF THE INVENTION

Accordingly, it is an object of the invention to provide a method of locating power plane-to-power plane shorts.

It is another object of the invention to provide a method of locating very fine short defects which can only withstand minimal current stress.

It is a further object of the invention to provide a method of locating high resistance shorts in the presence of significant capacitance between power planes.

It is yet another object of the invention to provide a method and a apparatus to perform a simple test to thousands of I/O nets for detecting shorts between power planes and to provide an apparatus for locating these shorts.

It is still another object of the invention to provide a low cost alternative to supplement expensive equipment commonly required for AOI (Automated Optical Inspection).

It is yet a further object of the invention to provide high yield and diagnostic leverage by targeting selected common classes of fatal short defects, such as power plane shorts or I/O net-to-power plane shorts.

SUMMARY OF THE INVENTION

In a primary aspect of the invention, a magnetic field generating probe is provided to magnetically locate power plane-to-power plane shorts.

In another aspect of the invention, an apparatus is provided to test the impedance between power planes and the impedance between each power plane and an I/O plane (i.e., with all the BSM I/O nets shorted together). The field generating probe approach is generalized to isolate the location of the shorts for repair and for diagnostic purposes for both, the case of power plane-to-power plane short and I/O net-to-power plane short.

In yet another aspect of the invention, power plane-to-power plane shorts and I/O net-to-power plane shorts are located by a magnetic field generating probe. An AC voltage, typically in the frequency range of 100 Hz to 3 MHz, is applied across the magnetic field generating probe. Current at the applied frequency flowing through the probe is inversely proportional to the impedance of the probe. The alternating magnetic field generated by the probe, which extends into the surface of the MCM-D module or PCB, is proportional to the current flowing through it. When the alternating magnetic field is in the vicinity of the short, the induced voltage between the shorted nets is proportional to the frequency and to the strength of the magnetic field. Furthermore, when in close proximity of the short, the magnitude of the induced voltage increases since the magnetic field at the short is strongest. The voltage across the shorted nets is 90° out-of-phase with the magnetic field creating it.

An effective way to produce a readable voltage is by way of a lock-in amplifier, wherein the lock-in reference voltage is applied across the magnetic field producing probe, and the signal voltage between the shorted planes is inputted into the input terminal of the lock-in amplifier.

DESCRIPTION OF THE PREFERRED EMBODIMENT OF THE INVENTION

Figure 1:
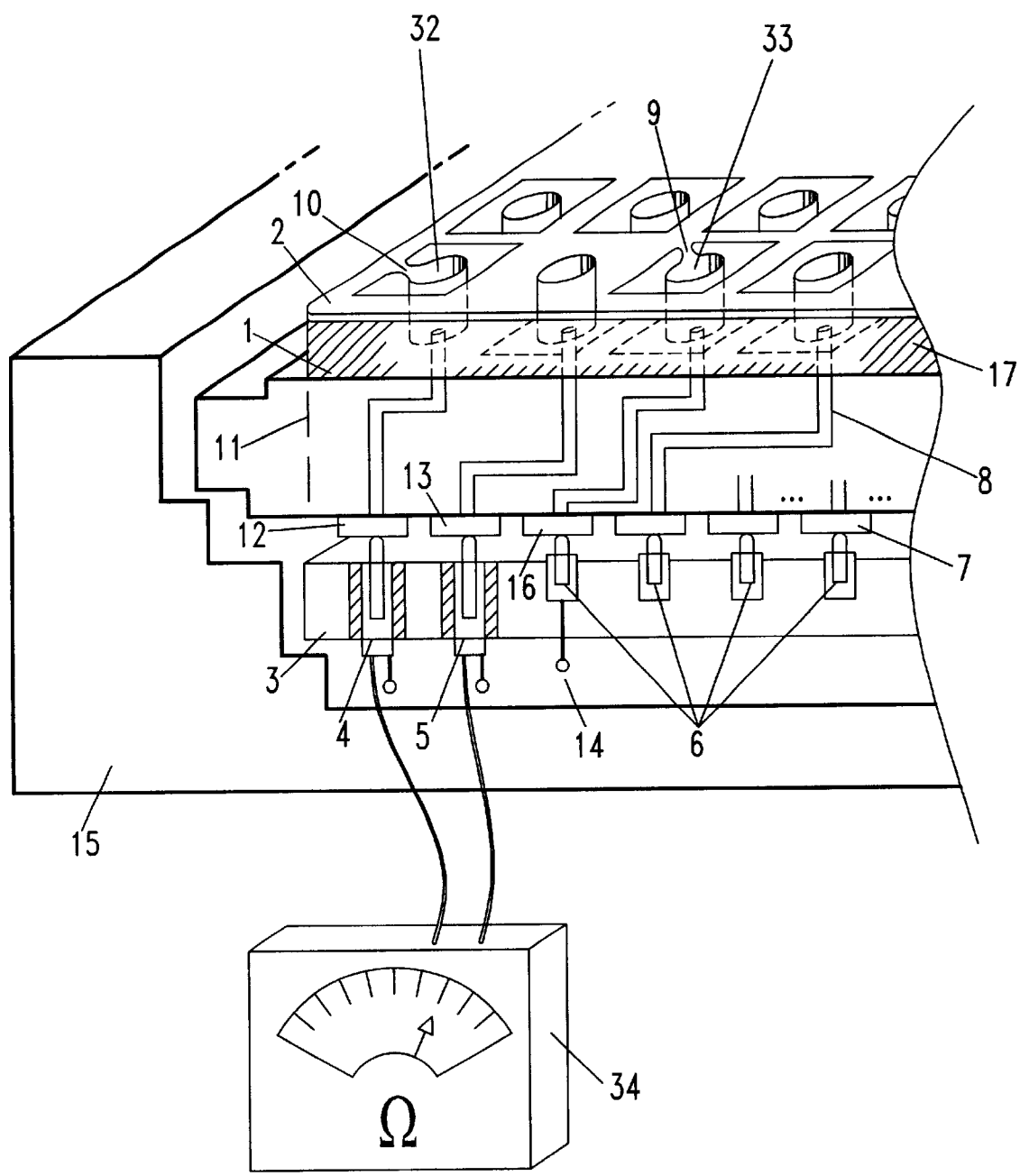
FIG. 1 is a schematic diagram of a module showing both, a power plane-to-power plane short and an I/O net-to-power plane short, and an apparatus for detecting the presence of the aforementioned defects while performing a resistive test, an accordance with the present invention.

Referring now to FIG. 1, there is shown a schematic diagram of a module or a board (or substrate) showing a short between power planes, and a short between an I/O net and a power plane.

Practitioners of the art will appreciate that I/O nets refer to any and all wiring nets leading to a module or board pin. Hereinafter, they will be referred to I/O nets.

A module or board 11 is mounted on a fixture 15. Bottom surface metallurgy (BSM) pads referenced by numerals 7, 12, 13 and 16, provide connections to the wiring throughout the module or board, as well as to the power planes. Wiring 8 connects the BSM pads to the top surface metallurgy. Voltage BSM pad 12 connects power plane 1 to TSM pad 32. Plane 1 is depicted shorted to plane 2 by way of short 10. Voltage BSM pad 13 is connected to power plane 2. I/O BSM pad 16 is connected internally to TSM pad 33. Power plane 2 is shown shorted to the I/O net associated with TSM pad 33 by way of short 9. Insulation 17 separates the power planes and the TSM wiring.

A metal block 3 positioned between module 11 and fixture 15 is provided with pogo pins. Two of the pins, 4 and 5, are shown insulated from conductive block 3, establishing a non-shorting connection to power planes 1 and 2. All the remaining pins contacting the BSM I/O pads are shorted together by metal block 3. Accordingly, a single connection to metal block 3 contacts thousands of I/O nets and creates a single I/O plane entity, enabling to test for shorts between the I/O nets and each power plane.

An ohmmeter 34 is shown connected across pin 4 (i.e power plane 1) and pin 5 (i.e. power plane 2). This meter reading detects the presence of a short-circuit caused by short 10. Alternatively, if the ohmmeter is connected between pin 5 (power plane 2) and pin 14 (i.e., I/O net plane 3 with all the I/O nets shorted together), a short-circuit 9 will be detected. Normally, the ohmmeter will detect the existence of a short but not its precise location.

Figure 2:
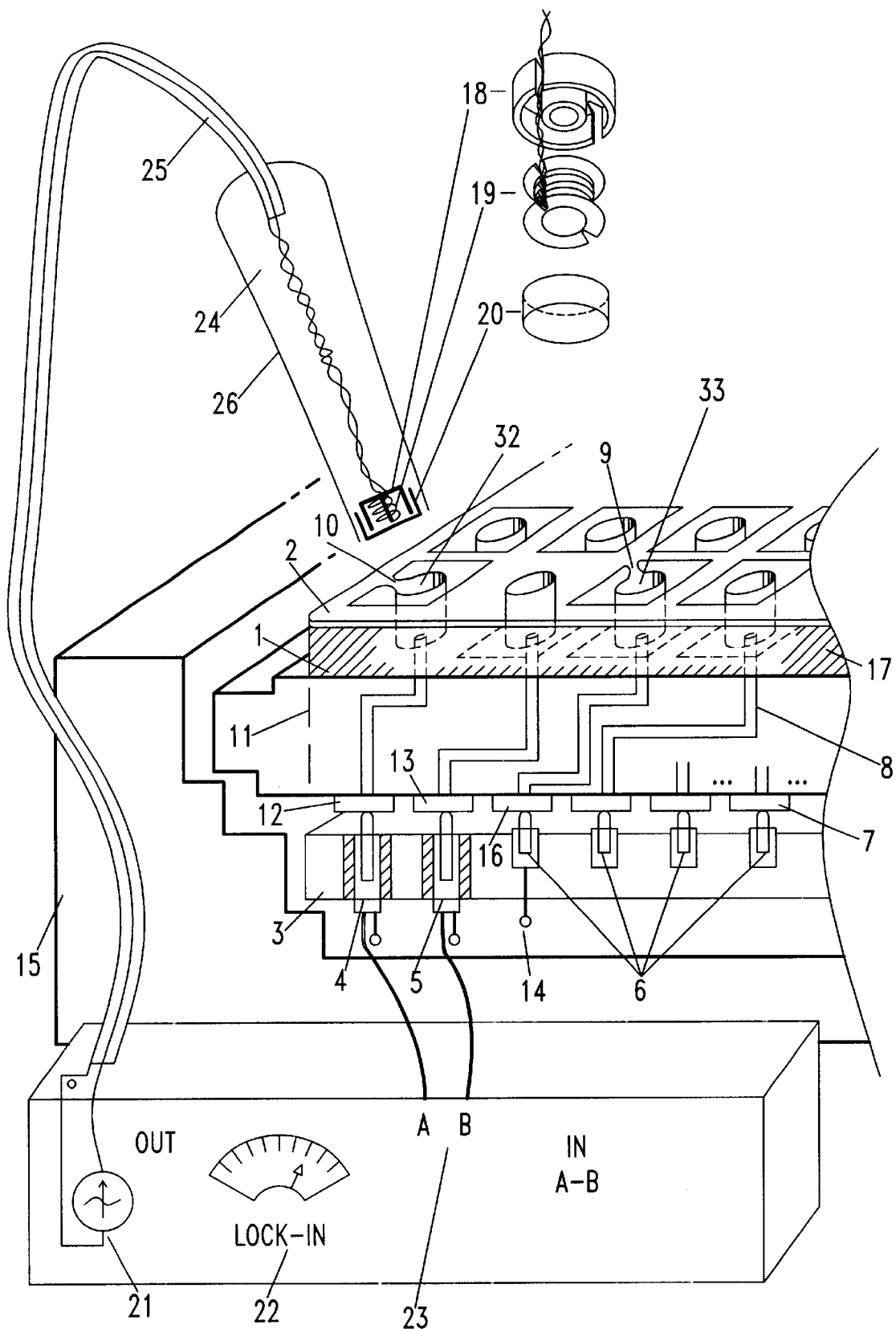
FIG. 2 is a schematic diagram showing a Faraday induction coil to locate shorts between power plane-to-power plane or I/O nets-to-power planes, and more particularly for high resistance shorts when the apparatus operates at low frequencies.

Referring now to FIG. 2, once a short between a power plane-to-power plane or an I/O net-to-power plane has been detected, a magnetic inspection technique for precisely determining its position is initiated.

A magnetic field generating probe 24 is used to locate shorts between power plane-to-power planes (e.g., short 10) or between I/O net-to-power planes (e.g., short 9). More particularly, it detects high resistance shorts (1KΩ or higher) when the apparatus is operated at low frequencies (e.g., 500 Hz to 100 Khz). Fixture 15 which was described in detail in FIG. 1 can also be used to magnetically locate either power plane-to-power plane shorts or I/O net-to-voltage plane shorts. For either type of shorts, probe 24 is used as a magnetic field generator rather than as a field sensor. This has several advantages over prior art setups which require a large current to flow through the module or board. In prior art setups for power plane-to-power plane shorts, a high frequency current was driven through the shorts in the PCB or MCM under test. In the invention, the test is conducted by passing current through the probe rather than by having current flowing through the defect. If the short is localized, i.e., it does not create a conductive haze over a large area, there will be a small voltage induced between the power planes 90° out-of-phase with the current at the tip of the probe when the tip is in close proximity to the short. The coil is preferably designed to withstand significantly higher currents than the board itself (which is fragile and expensive) to boost the field being generated. As such, using a coil with high inductance increases the strength of the magnetic field. A ferrite pot core, opened at one side, confines the magnetic field. In this manner, the board under inspection is subjected to minimal current stress and is unlikely to blow a filamentary short.

This method allows handling large currents and makes it possible to operate at a lower frequency than previously possible, while still having sufficient signal to work with. The high current and high inductance of probe 24 is adequate to ensure sufficient signal since the induced voltage between the module or board planes drops linearly with decreasing frequency, but it linearly increases with increased current. This is particularly important for high resistance shorts, i.e., 1 kΩ or higher. Practitioners in the art will fully realize that at higher frequencies, the capacitive impedance between power plane-to-power planes will be lower than that found in a high impedance short, thereby reducing the magnitude of the induced signal. This makes locating such a short difficult. It is possible to minimize this effect by operating at lower frequencies, such as in the 100 Hz to 100 KHz range. A lock-in amplifier 22, which correlates a reference input signal at a single frequency to the output signal is highly sensitive and well suited for detecting induced voltages. At low frequencies, the effect of the impedance of the plane-to-plane capacitance is reduced.

In addition to the problems caused by capacitance from a power plane-to-power plane short, capacitance between the tip of the probe and the module or board under inspection may also degrade the inspection in progress. Since capacitive coupling between the probe and the PCB or MCM may become a problem, two methods may be used to minimize its effect. Firstly, capacitive effects will be minimized at low frequencies, (whenever it is possible to operate at low frequencies). This is particularly appropriate for low resistance shorts. A simple inductor 19 is placed at the tip of the probe 24. The inductor selected is as large as it is practical to obtain a larger magnetic field strength and is encased in a pot core 18 opened at the module or board end for magnetic shielding. Secondly, one can reduce the capacitive effect from the tip of the probe to the module by appropriate electrostatic shielding. Then, the opened part of the ferrite (magnetically shielded) pot core 18 may be covered with electrostatic shielding material 20, preferably with a thin sheet of copper. This minimizes any capacitive effects between the probe and the module. The electrostatic shielding material may be grounded if desired, although it is not deemed absolutely necessary.

By way of example, a short 10 is presumed to exist between power plane 1 and power plane 2 somewhere in the active area of the board. Normally, contact points 4 and 5 contacting power planes 1 and 2, respectively, are normally insulated by polyimide layer 17 or by some other appropriate insulating layer. An indication that a short exists is easily seen using a resistance test between contact points 4 and 5 on the non-destructive fixture 15 upon which the module or board, module, or board 11 is positioned. The location of the short is presumed to be unknown.

An operator manually moves the magnetic field generating probe 24 around the surface of the module or board to determine where the strongest magnetic coupling is found. A strong localized signal or the presence of a signal which changes sign indicates the proximity of the short 10. A magnetic field generating device 19 may be mounted at the tip of the mechanical probe for manual use, or mounted to the tip of a microscope for an automated use. A periodic current (preferably sinusoidal) drives the inductive element at the tip of the probe which may be driven at a high current and at a low frequency. The magnetic field induces a sinusoidal voltage between shorted power planes 1 and 2 when the tip is in the vicinity of the short. The lock-in amplifier can advantageously be used both to provide the voltage which drives the inductive element at the tip and to correlate the driving voltage with the induced voltage seen between the power planes. The periodic current driving the tip may be generated by the reference output (i.e., the standard output of lock-in amplifier 22 which is a periodic signal at a predetermined frequency). The periodic voltage 23 between planes (which is induced as a response to the derivative of the magnetic flux near the tip due to mutual inductance between the shorted planes and tip when in close proximity to the short) may be detected by the lock-in amplifier 22, preferably using the high impedance input. Probe 24 includes an insulated eye dropper sized case 26 to allow the operator hold the probe and scan a part manually. A 50Ω coax cable 25 provides power to the inductive coil at the probe tip, which may preferably be wound around a plastic bobbin 19. The coil and bobbin 19 are inserted inside a ferrite pot core 18 which is to direct the oscillating magnetic field. The opened area of the pot core may be covered with an electrostatic shielding material such as thin copper or aluminum foil 20 to minimize capacitive coupling.

The primary purpose of the magnetic field generating probe 24 is to induce a signal between planes. This signal will be maximized when the probe tip is close to the power plane-to-power plane short. An operator will move the probe above and around the two-dimensional TSM of the board, searching for the power plane-to-power plane short 10 by looking where the magnitude of the induced voltage between planes is strongest and localized and/or where it sharply reverses phase in a small localized area.

There are two techniques for driving the magnetic field generating probe 24. The first drives the induction coil directly using the reference-out signal 21 of the lock-in amplifier 22. In this case, no other special electronics is required. The lock-in amplifier drives the magnetic field generating probe 24 in a periodic manner using the reference-out signal 21, providing power to the probe through a 50Ω coax cable 25. In this case, the amount of current to the probe may be limited by the lock-in amplifier (although additional electronics could be placed between the reference-out of the lock-in amplifier and the probe).

A second technique for driving the magnetic field generating probe 24 is to use an external oscillator connected to the reference-in of the lock-in amplifier and using an amplifier to drive the probe at the desired higher currents. In this case, the probe would be driven by a periodic voltage source provided separately from the lock-in amplifier and made as large as safety considerations allow. In this mode the lock-in would input this periodic signal through the standard lock-in amplifier reference input (not shown) and correlate this signal with the signal seen between power planes.

The lock-in amplifier 22 correlates the induced periodic voltage difference seen between the power plane 1 and the power plane 2 with the reference voltage signal 21 used to drive the probe. The lock-in correlation may be used in two ways. In a first approach, the magnitude of the output signal at the reference frequency may be displayed. This value sharply peaks when the probe tip is in the vicinity of a localized power plane-to-power plane short. In a second approach, the component of the induced signal (i.e., a preset phase difference from the input reference-out), is displayed. This value peaks locally when the probe tip is in the vicinity of a localized power plane-to-plane short 10. It also sharply switches due to a reversal of direction of the magnetic field when the probe tip crosses from one side of the short to the other.

In the second approach, the phase sensitive amplitude signal is displayed, which changes by 180° as the probe moves across the short. Therefore the output signal, (i.e., the amplitude of the signal times the cosine of the phase angle between the signal and reference), changes from a positive to negative value. A dual output lock-in may display both these values simultaneously. An operator may observe the output on the lock-in display visually, or the output may drive a voltage controlled oscillator which drives a speaker to assist the operator in localizing the short. The lock-in amplifier uses one frequency to stimulate the probe output and the same to examine the input and will be very well suited to picking up a very weak signal, rejecting signals at other frequencies.

Figure 3:
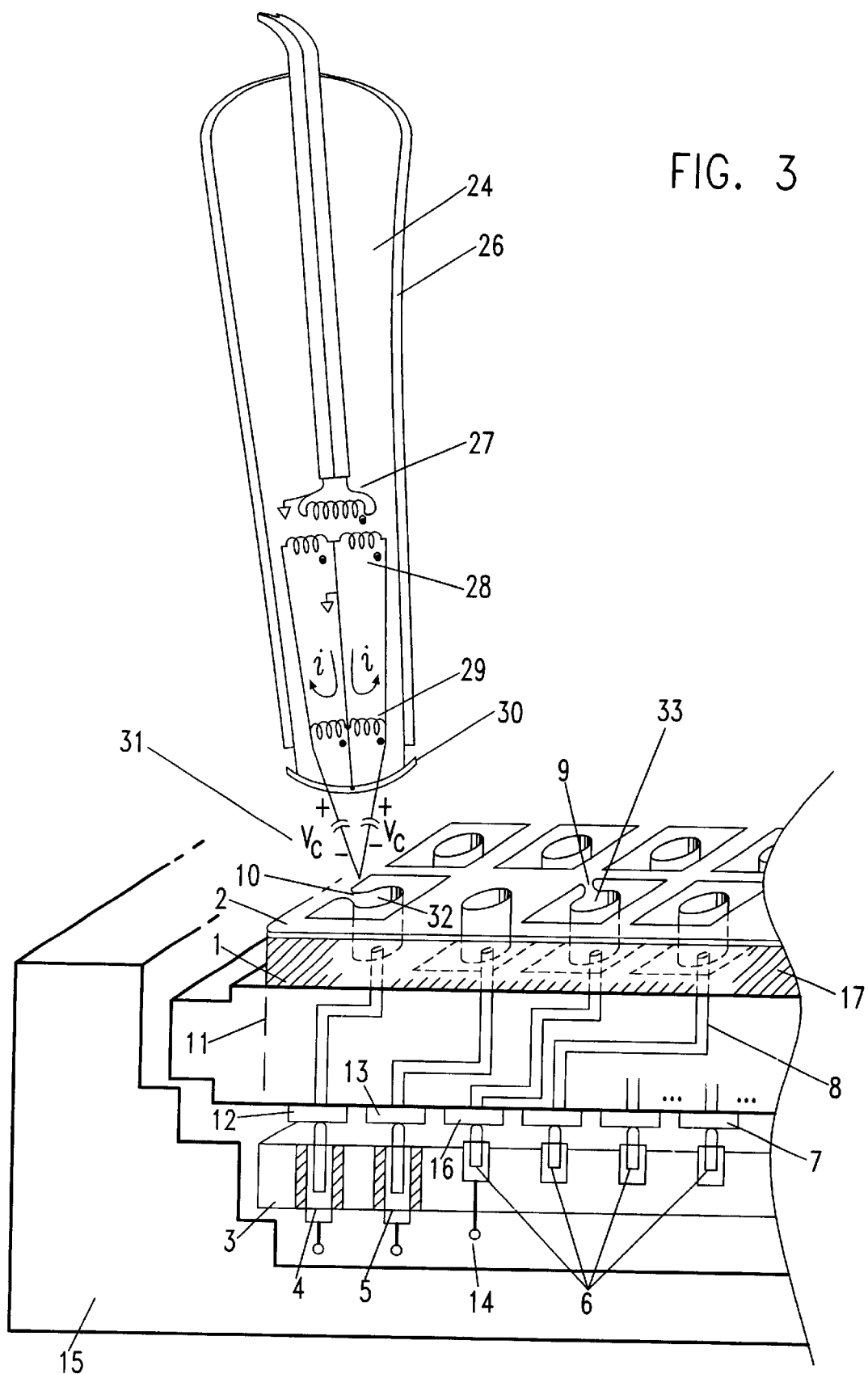
FIG. 3 is a schematic diagram of a dual Faraday induction coil to locate shorts between power plane-to-power plane or I/O nets-to-power planes, and more particularly for low resistance shorts when the apparatus is operated at high frequencies.

Referring now to FIG. 3, there is shown a schematic diagram of a magnetic field generating probe having a dual induction coil to locate shorts between power plane-to-power plane or I/O nets-to-power planes, and more particularly for low resistance shorts when the apparatus is operated at high frequencies.

The method of locating a low resistance power plane-to-power plane short or an I/O net-to-power plane short at high frequencies (greater than 100 khz) is as follows:

If the short has sufficiently low resistance, the capacitive impedance between planes will not significantly affect the inspection using the magnetic field generating probe and one can gain additional induced signal by going to higher frequencies. However, at some point, when increasing frequency there will be an increase in electrostatic capacitive coupling 31 between the probe and the board or module which will degrade the signal.

At high frequencies, there are advantages in using a differential probe designed in order to have the capacitive electrostatic coupling terms cancel out. The center tap of the coil should be grounded to eliminate electrostatic effects.

Power is provided to probe 24 through a 50Ω coax cable 25. A dual coil transformer 27 drives a matched set of coils 29 at the tip of the probe. The center tap of the coil should be grounded to eliminate any electrostatic effect. Each coil adds additional magnetic field with respect to the induced voltage in the shorted net 10. Alternatively, the electrostatic capacitive effect 31 of the dual coils tends to subtract and cancel each other. This approach provides a differential coil suitable for use at high frequencies in the presence of significant electrostatic coupling. (Note: a dual coil arrangement may be simplified by using a center tapped transformer 28 with the center tap grounded driving a single probe coil 29. This single probe coil will display the same advantage).

The probe configuration shown in FIG. 3 minimizes the electro-static static effect and maximizes the signals which indicates the proximity of the probe to the power plane-to-power plane short. As before one can apply electrostatic shielding material to the tip 30 of the probe 24 to enhance the performance.

Whereas this invention has been described in terms of preferred embodiments, it is understood that various modifications and extensions, such as using the fixture described in the invention to blow BSM I/O-to-power plane shorts if one were unsuccessful in locating the short, will occur to a person skilled in the art without departing from the spirit and scope of the claimed invention.

What is claimed is:

1. A method of inspection for pinpointing the position on a board or a module of a short between power planes of between an I/O net and a power plane, said short being known to exist somewhere on said board or said module but its exact location being unknown, the method comprising the steps of:

movably scanning said board or said module with a magnetic field generation probe searching for a minimum or a maximum induced voltage; and pinpointing the exact position of said short by sensing said induced voltage between said shorted power planes or said shorted I/O net to power plane when said magnetic field generating probe detects said induced voltage at said minimum or said maximum induced voltage.

2. The method as recited in claim 1, further comprising the step of placing said board or said module on a test fixture.

3. The method as recited in claim 2, wherein said test fixture includes a conductive block such that at least two of said I/O nets are simultaneously contacted.

4. The method as recited in claim 3, wherein a resistive test provides detection of a short between said power planes and any one of said I/O nets contacted by said conductive block.

5. The method as recited in claim 1, further comprising the step of coupling said magnetic field generating probe to a reference terminal of a lock-in amplifier to provide means for generating a magnetic field and coupling said power planes to input terminals of said lock-in amplifier for sensing an induced voltage.

6. The method as recited in claim 1, wherein detecting said power plane-to-power plane short or said I/O net-to-power plane short is achieved by first subjecting said board or said module to a resistive test.

7. The method as recited in claim 1, wherein said magnetic field generating probe is an inductor.

8. The method as recited in claim 1, wherein said magnetic field generating probe is a transformer.

9. The method as recited in claim 1, wherein said magnetic field generating device is mounted at the tip of a mechanical probe.

10. The method as recited in claim 1, wherein said magnetic field generating device is mounted to the tip of a microscope objective.

11. The method as recited in claim 1 wherein a layer of conductive foil is placed at the tip of said magnetic field generating probe to minimize electrostatic coupling between a substrate under inspection and said magnetic field generating probe.

12. The method as recited in claim 11 wherein said layer of conductive foil is grounded and positioned between said substrate under inspection and said magnetic field generating probe.

13. A method of inspection for pinpointing the position on a board or a module of a short between power planes or between and I/O net and a power plane, said short having a resistance exceeding 1 KΩ being known to exist by prior testing but its exact location being unknown, the method comprising the steps of:

movably scanning said board or said module with a magnetic field generating probe searching for a minimum or a maximum induced voltage, said magnetic field generating probe generating electrical signals having a frequency ranging from 100 Hz to 100 KHz at the tip of said magnetic field generating probe;

coupling said magnetic field generating probe to a reference terminal of a lock-in amplifier to provide means for generating a magnetic field and coupling said power planes to input terminals of said lock-in amplifier for sensing said induced voltage; and pinpointing the exact location of said short by sensing said induced voltage between said shorted power planes or between said shorted I/O net and said power plane, and correlating said induced voltage to said current passing through said tip when said magnetic field generating probe detects said induced voltage at said minimum or said maximum induced voltage.

14. The method as recited in claim 13, wherein said magnetic field generating probe is an inductor housed in a pot core open at one end.

15. The method as recited in claim 13 wherein a layer of conductive foil is placed at the tip of said magnetic field generating probe, said probe including a pot core to minimize electrostatic coupling between a substrate under inspection and said magnetic field generating probe.

16. The method as recited in claim 5 wherein said layer of conductive foil is grounded and positioned between said substrate under inspection and said pot core.

17. A method of inspection for pinpointing the position on a board or a module of a short having a resistance below 1 KΩ between power planes or between an I/O net and a power plane, said short being known to exist by prior testing but its exact location being unknown, the method comprising the step of:

movably scanning said board or said module with a magnetic field generating probe ending in a tip, said probe searching for a minimum or a maximum induced voltage, said magnetic field generating probe generating electrical signals having a frequency ranging from 100 KHz to 3 MHz; and pinpointing the exact position of said short between said shorted power planes or between said I/O net and said power plane by sensing said induced voltage at said minimum or said maximum induced voltage.

18. The method as recited in claim 17, wherein said magnetic field generating probe is a dual coil transformer with a center tapped grounded secondary coil.

19. The method as recited in claim 18, wherein said dual coil transformer drives matched dual wound inductors.

20. The method as recited in claim 18, wherein said dual coil transformer drives a simple inductive coil.

21. The method as recited in claims 18, wherein said dual coil transformer minimizes a capacitive coupling between said magnetic field generating probe and said board or said module.

22. The method as recited in claim 17 wherein a layer of conductive foil is placed at the tip of said magnetic field generating probe that includes an inductor to minimize electrostatic coupling between a substrate under inspection and said magnetic field generating probe.

23. The method as recited in claim 22 wherein said layer of conductive foil is grounded and positioned between said substrate under inspection and said inductor.

24. A method of inspection for pinpointing the position on a board or a module of a short having a resistance below 1 KΩ between power planes or between an I/O net and a power plane, said short being known to exist by prior testing but its exact location being unknown, the method comprising the steps of:

movably scanning said board or said module with a magnetic field generating probe ending in a tip, said magnetic field generating probe generating electrical signals having a frequency ranging from 100 kHz to 3 MHz, searching for a minimum or a maximum induced voltage;

coupling said magnetic field generating probe to a reference terminal of a lock-in amplifier to provide means for generating a magnetic field and coupling said power planes to input terminals of said lock-in amplifier for sensing an induced voltage; and pinpointing the exact position of said short by sensing said induced voltage between said shorted power planes or between said shorted I/O net and said power plane, and correlating said induced voltage to current passing through said tip when said magnetic field generating probe detects said induced voltage at said minimum or said maximum induced voltage.

25. The method as recited in claim 24, wherein said dual coil transformer drives matched dual wound inductors.

26. The method as recited in claim 24, wherein said dual coil transformer drives an inductive coil.

27. The method as recited in claims 24, wherein said dual coil transformer minimizes a capacitive coupling between said magnetic field generating probe and said board or said module.

28. The method as recited in claim 24, wherein a layer of conductive foil is placed at the tip of said magnetic field generating probe to minimize electrostatic coupling between a substrate under inspection and said magnetic field generating probe.

29. The method as recited in claim 28 wherein said layer of conductive foil is grounded and positioned between said substrate under inspection and said magnetic field generating probe.

* * * * *